(12) United States Patent
Hioka et al.

(10) Patent No.: US 10,429,453 B2
(45) Date of Patent: Oct. 1, 2019

(54) MAGNETIC SENSOR AND METHOD OF MANUFACTURING THE SAME

(71) Applicant: SII Semiconductor Corporation, Chiba-shi, Chiba (JP)

(72) Inventors: Takaaki Hioka, Chiba (JP); Mika Ebihara, Chiba (JP); Hiroshi Takahashi, Chiba (JP); Matsuo Kishi, Chiba (JP); Miei Takahama, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/458,499

(22) Filed: Mar. 14, 2017

(65) Prior Publication Data

US 2017/0269169 A1    Sep. 21, 2017

(30) Foreign Application Priority Data

Mar. 15, 2016   (JP) .................................. 2016-051498

(51) Int. Cl.
*H01L 43/06* (2006.01)
*H01L 43/14* (2006.01)
(Continued)

(52) U.S. Cl.
CPC ......... *G01R 33/0052* (2013.01); *G01R 33/07* (2013.01); *H01L 43/065* (2013.01); *H01L 43/14* (2013.01)

(58) Field of Classification Search
None
See application file for complete search history.

(56) References Cited

U.S. PATENT DOCUMENTS

| 5,198,795 | A | 3/1993 | Shibasaki et al. |
| 9,546,090 | B1 * | 1/2017 | Xia .................... B81C 1/00253 |

(Continued)

FOREIGN PATENT DOCUMENTS

| JP | 2002-071381 A | 3/2002 |
| WO | WO 2007/119569 A | 10/2007 |

OTHER PUBLICATIONS

Office Action in U.S. Appl. No. 15/458,578, dated Aug. 22, 2017, 9 pages.

(Continued)

*Primary Examiner* — Bo B Jang
(74) *Attorney, Agent, or Firm* — Brinks Gilson & Lione

(57) ABSTRACT

The magnetic sensor includes a semiconductor substrate having Hall elements on a front surface of the semiconductor substrate, an adhesive layer formed on a back surface of the semiconductor substrate, and a magnetic flux converging plate formed on the adhesive layer. The magnetic flux converging plate is formed on the back surface of the semiconductor substrate through formation of the magnetic flux converging plate by electroplating on a base conductive layer formed on a plating substrate prepared separately from the semiconductor substrate, application of an adhesive for forming the adhesive layer onto a surface of the magnetic flux converging plate so that the magnetic flux converging plate adheres to the back surface of the semiconductor substrate, and peeling off of the plating substrate afterward from the base conductive layer formed on the magnetic flux converging plate.

6 Claims, 4 Drawing Sheets

(51) Int. Cl.
 *G01R 33/00* (2006.01)
 *G01R 33/07* (2006.01)

(56) References Cited

U.S. PATENT DOCUMENTS

2002/0021124 A1* 2/2002 Schott .................... G01D 5/145
 324/207.2
2014/0367813 A1* 12/2014 Ryu ........................ H01L 43/04
 257/421

OTHER PUBLICATIONS

Office Action in U.S. Appl. No. 15/458,578, dated Feb. 28, 2018, 11 pages.

* cited by examiner

MAGNETIC SENSOR AND METHOD OF MANUFACTURING THE SAME

RELATED APPLICATIONS

This application claims priority under 35 U.S.C. § 119 to Japanese Patent Application No. 2016-051498 filed on Mar. 15, 2016, the entire content of which is hereby incorporated by reference.

BACKGROUND OF THE INVENTION

1. Field of the Invention

The present invention relates to a magnetic sensor using Hall elements, and to a method of manufacturing the magnetic sensor, in particular, relates to a magnetic sensor, which includes a magnetic flux converging plate, and is configured to detect vertical and horizontal magnetic fields, and to a method of manufacturing the magnetic sensor.

2. Description of the Related Art

Hall elements are used in various applications since non-contact position detection and non-contact angle detection can be made by Hall elements as magnetic sensors.

First, the principle of magnetic detection with the Hall elements is described. When a magnetic field is applied vertically to a current flowing through a substance, an electric field (Hall voltage) is generated in a direction vertical to both the current and the magnetic field. Typical Hall elements are thus configured to detect a vertical magnetic field component with a current caused to flow on a surface of a semiconductor substrate or a wafer made of silicon or other materials.

In addition, it is known that the Hall elements can detect not only a vertical magnetic field but also a horizontal magnetic field in combination with a magnetic thin film made of a material having high magnetic permeability, with use of the magnetic thin film as a magnetic flux converging plate configured to change a direction of a magnetic flux to guide the magnetic flux to the Hall elements (see, for example, Japanese Patent Application Laid-open No. 2002-071381).

The magnetic sensor including the magnetic flux converging plate may be manufactured as follows. For example, the Hall elements are formed on the silicon substrate, and then the magnetic flux converging plate is formed on the silicon substrate by electroplating. Alternatively, a protective film made of polyimide or other materials is formed on a front surface of the silicon substrate, and the magnetic flux converging plate is formed on the protective film by electroplating (for example, see WO 07/119569 A1).

When the magnetic flux converging plate is formed on the silicon substrate having the Hall elements formed thereon, large stress is generated on the silicon substrate because the thermal expansion coefficients of a metal magnetic body and the silicon substrate or the protective film made of polyimide or other materials are significantly different from each other. The stress affects the magnetic sensor, increasing shift and fluctuations in the magnetic characteristics.

SUMMARY OF THE INVENTION

In view of this, the present invention has made to provide a magnetic sensor capable of suppressing an influence due to stress to achieve less shift or fluctuations in magnetic characteristics, and to provide a method of manufacturing the magnetic sensor.

According to one embodiment of the present invention, there is provided a magnetic sensor, including: a semiconductor substrate including Hall elements on a front surface of the semiconductor substrate; an adhesive layer formed on a back surface of the semiconductor substrate; and a magnetic flux converging plate formed on the adhesive layer.

According to one embodiment of the present invention, there is provided a method of manufacturing a magnetic sensor, the method including: forming Hall elements on a front surface of a semiconductor substrate; forming a base conductive layer on a plating substrate; forming, on the base conductive layer, a resist having an opening for forming a magnetic flux converging plate; forming a magnetic flux converging plate in the opening by performing electroplating under a state in which the resist is formed; removing the resist; removing a part of the base conductive layer by etching with use of the magnetic flux converging plate as a mask; applying an adhesive onto the magnetic flux converging plate; bonding a back surface of the semiconductor substrate and the magnetic flux converging plate formed on the plating substrate to each other with use of the adhesive; and peeling off the plating substrate from the base conductive layer.

According to one embodiment of the present invention, the magnetic flux converging plate is formed on the back surface of the semiconductor substrate including the Hall elements on the front surface thereof. Thus, stress generated due to a difference in coefficient of thermal expansion between the semiconductor substrate and the magnetic flux converging plate is applied to the semiconductor substrate from the back surface side. As a result, stress to be applied to the Hall elements formed on the front surface side of the semiconductor substrate can be suppressed by the amount of the thickness of the semiconductor substrate. Time-dependent change or fluctuations in the magnetic characteristics of the magnetic sensor can thus be reduced.

DETAILED DESCRIPTION OF THE PREFERRED EMBODIMENTS

A detailed description is now given of an embodiment of the present invention with reference to the drawings.

Figure 1:
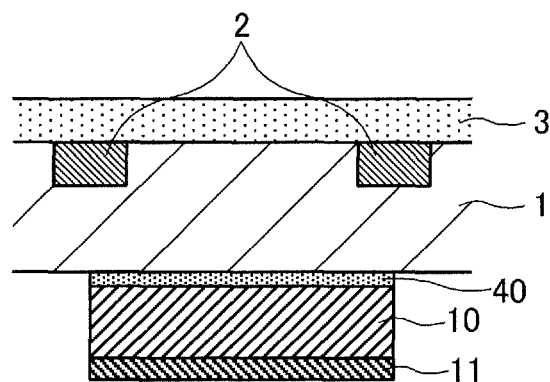
FIG. 1 is a sectional view for illustrating the structure of a magnetic sensor according to an embodiment of the present invention.

FIG. 1 is a sectional view for illustrating the structure of a magnetic sensor according to the embodiment of the present invention.

As illustrated in FIG. 1, the magnetic sensor according to this embodiment includes a semiconductor substrate 1, a pair of Hall elements 2, which is formed on a front surface of the semiconductor substrate 1, and is formed so as to be separated from each other, a protective film 3 covering the front surface of the semiconductor substrate 1 including the Hall elements 2, an adhesive layer 40 formed on a back surface of the semiconductor substrate 1, a magnetic flux converging plate 10 mounted on the back surface of the semiconductor substrate 1 through intermediation of the adhesive layer 40, and a conductive layer 11 formed on a surface of the magnetic flux converging plate 10 on the opposite side of the adhesive layer 40.

In this embodiment, the semiconductor substrate 1 is a P-type semiconductor substrate, and each of the Hall elements 2 is a horizontal Hall element including a square or cross-shaped vertical magnetic field sensing portion having a four-fold rotational axis, and, at respective vertices and end portions thereof, vertical magnetic field detection control current input terminals and vertical magnetic field Hall voltage output terminals corresponding to surface N-type highly-doped regions having the same shape.

The positional relationship between the Hall elements and the magnetic flux converging plate is important in order to achieve a magnetic sensor having small fluctuations in characteristics. The magnetic flux converging plate 10 is formed so as to overlap with at least a part of each of the pair of Hall elements 2 in plan view.

With this configuration, stress generated due to a difference in coefficient of thermal expansion between the semiconductor substrate 1 and the magnetic flux converging plate 10 is applied to the semiconductor substrate 1 from the back surface side. As a result, stress to be applied to the Hall elements 2 formed on the front surface of the semiconductor substrate 1 may be suppressed by the amount of the thickness of the semiconductor substrate 1. In this manner, the magnetic sensor having small temporal change or fluctuations in the magnetic characteristics may be obtained.

In this case, when the thickness of the semiconductor substrate 1 is excessively large, the distance between the magnetic flux converging plate 10 and the Hall elements 2 formed on the front surface of the semiconductor substrate 1 increases, and thus the sensitivity of the magnetic sensor may not be sufficient. Further, when the thickness of the semiconductor substrate 1 is excessively small, the stress applied to the Hall elements 2 formed on the front surface of the semiconductor substrate 1 increases. The thickness of the semiconductor substrate 1 is thus preferred to be from about 100 µm to about 400 µm.

Further, when the thickness of the magnetic flux converging plate 10 is excessively small, the sensitivity of the magnetic sensor decreases. Further, when the thickness of the magnetic flux converging plate 10 is excessively large, the influence due to stress increases. The thickness of the magnetic flux converging plate 10 is thus preferred to be from about 20 µm to about 50 µm.

Next, a method of manufacturing the magnetic sensor illustrated in FIG. 1 is described with reference to FIG. 2A to FIG. 4B.

Figure 2A:
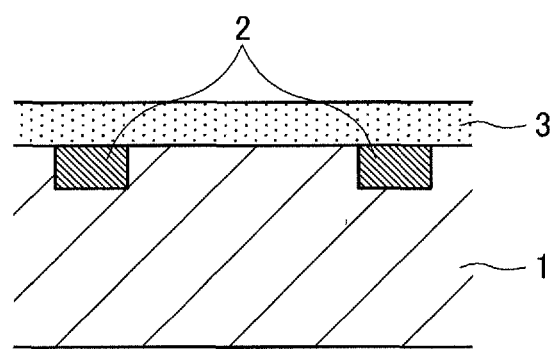
FIG. 2A and FIG. 2B are sectional views for illustrating steps of a method of manufacturing a magnetic sensor according to the embodiment of the present invention.
Figure 2B:
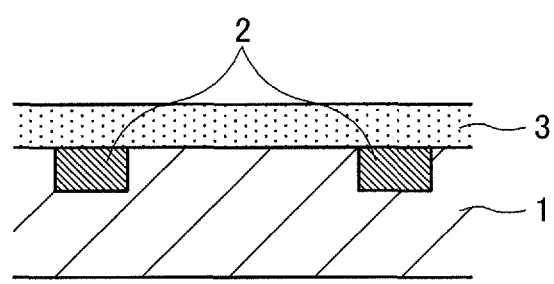
Figure 3A:
FIG. 3A, FIG. 3B, FIG. 3C, FIG. 3D, and FIG. 3E are sectional views for illustrating steps of the method of manufacturing a magnetic sensor according to the embodiment of the present invention.
Figure 3B:
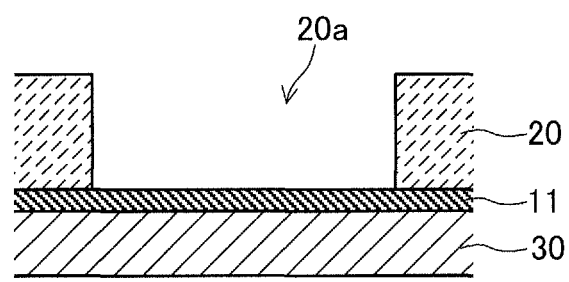
Figure 3C:
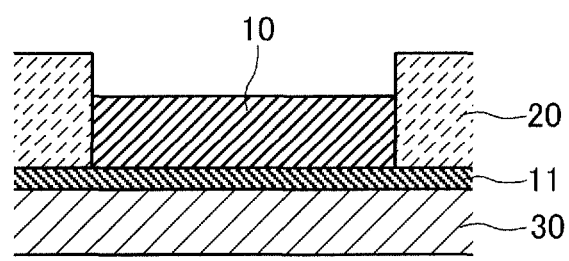
Figure 3D:
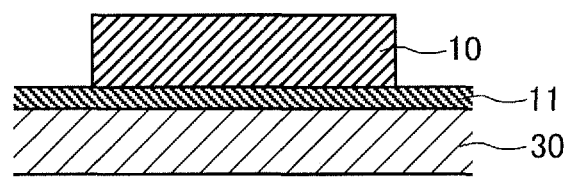
Figure 3E:
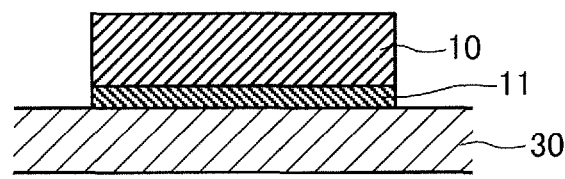
Figure 4A:
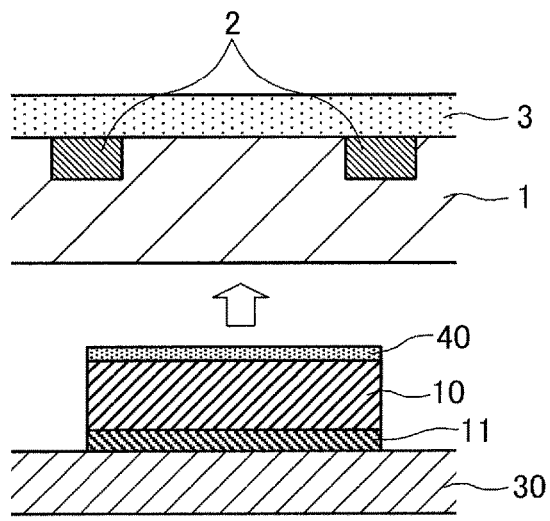
FIG. 4A and FIG. 4B are sectional views for illustrating steps of the method of manufacturing a magnetic sensor according to the embodiment of the present invention.
Figure 4B:
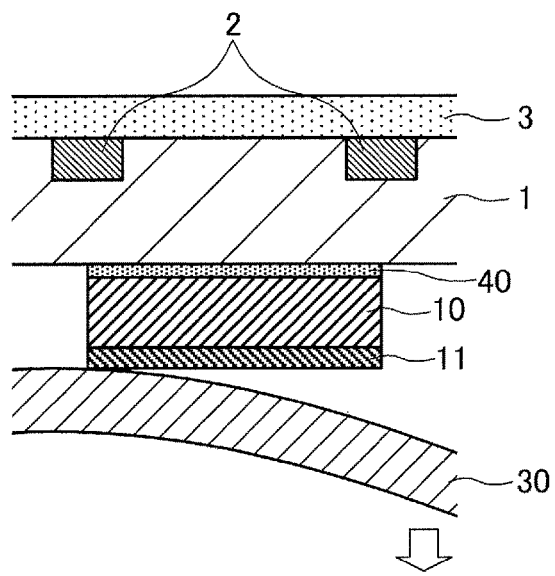

FIG. 2A to FIG. 4B are sectional views for illustrating steps of the method of manufacturing a magnetic sensor according to this embodiment. FIG. 2A and FIG. 2B are illustrations of a process of manufacturing the Hall elements, FIG. 3A to FIG. 3E are illustrations of a process of manufacturing the magnetic flux converging plate, and FIG. 4A and FIG. 4B are illustrations of a process of bonding the semiconductor substrate and the magnetic flux converging plate to each other.

First, as illustrated in FIG. 2A, on the front surface of the P-type semiconductor substrate 1, the Hall elements 2 and a peripheral circuit (not shown), for example, a control circuit for the Hall elements 2, are formed by a normal semiconductor manufacturing process.

Then, as illustrated in FIG. 2B, the back surface of the semiconductor substrate 1, which has the Hall elements 2 and the peripheral circuit formed thereon, is ground, to thereby reduce the thickness of the semiconductor substrate 1 to from about 100 µm to about 400 µm.

Next, as illustrated in FIG. 3A, separately from the semiconductor substrate 1, a plating substrate 30 for forming the magnetic flux converging plate is prepared, and a base conductive layer 11 for the magnetic flux converging plate 10 is formed on the plating substrate 30. In this case, the base conductive layer 11 for the magnetic flux converging plate 10 serves as an electrode for electroplating. Further, the plating substrate 30 is peeled off from the base conductive layer 11 in the subsequent process, and hence adhesiveness between the plating substrate 30 and the base conductive layer 11 is preferred to be weak. It is therefore suitable to use copper as the base conductive layer 11 and a silicon wafer or an acrylic plate as the plating substrate 30. Further, the thickness of the base conductive layer 11 is preferred to be from about 0.3 µm to about 1.0 µm in order to suppress stress.

Then, as illustrated in FIG. 3B, a resist 20 having an opening 20a (hereinafter also referred to as "opening for forming the magnetic flux converging plate") with a shape of the magnetic flux converging plate 10 to be formed is formed by photolithography. In this case, the thickness of the resist 20 is required to be larger than the thickness of the magnetic flux converging plate 10 to be formed, and hence the thickness of the resist 20 is desired to be from about 30 µm to about 60 µm.

Next, as illustrated in FIG. 3C, the magnetic flux converging plate 10 having a thickness of from about 20 µm to about 50 µm is formed in the opening 20a of the resist 20 by electroplating. The magnetic flux converging plate 10 is desired to be made of a soft magnetic material having low coercive force and high magnetic permeability, for example, permalloy or supermalloy.

Then, as illustrated in FIG. 3D, the resist 20 is removed to obtain the magnetic flux converging plate 10 having a desired shape.

Further, as illustrated in FIG. 3E, unnecessary part of the base conductive layer 11 is removed by etching with use of the magnetic flux converging plate 10 as a mask.

In this embodiment, the magnetic flux converging plate 10 is made of a soft magnetic material having low coercive force and high magnetic permeability, for example, permalloy or supermalloy, and hence it is desired to perform, after the plating, high-temperature annealing treatment at a temperature of from about 800° C. to 1,000° C. in a hydrogen atmosphere. With this, the soft magnetic property may be improved, and a magnetic flux converging plate having good performance may be obtained. In contrast, in the related-art method involving forming the magnetic flux converging plate on the semiconductor substrate by plating as described in the "Description of the Related Art" section, such annealing treatment cannot be performed because the elements formed on the semiconductor substrate may be affected. In this embodiment, a magnetic flux converging plate can thus be formed to have better performance than that of the magnetic flux converging plate formed by the related-art manufacturing method.

Even in this embodiment, the annealing treatment cannot be performed when an acrylic plate is used as the plating substrate 30, and hence a silicon wafer is used as the plating substrate 30 when annealing treatment is required to obtain a desired soft magnetic property.

Next, as illustrated in FIG. 4A, an adhesive (adhesive layer) 40 is applied onto the magnetic flux converging plate 10 formed on the plating substrate 30 in the steps illustrated in FIG. 3A to FIG. 3E. The adhesive 40 is required to have stronger adhesiveness to the semiconductor substrate 1 than to the base conductive layer 11 or the plating substrate 30. For example, an epoxy adhesive may be suitably used.

Then, the magnetic flux converging plate 10 formed on the plating substrate 30 is bonded to the back surface of the semiconductor substrate 1, which is formed in the steps illustrated in FIG. 2A and FIG. 2B, and has the Hall elements 2 formed on the front surface thereof, with use of the adhesive 40.

As described above, when the annealing treatment is performed after the magnetic flux converging plate 10 is formed, the magnetic flux converging plate 10 may warp or other strains may be caused in the magnetic flux converging plate 10. The semiconductor substrate 1, however, adheres to the magnetic flux converging plate 10 through intermediation of the adhesive 40, and hence the semiconductor substrate 1 and the magnetic flux converging plate 10 may be bonded to each other without a gap therebetween by adjusting the thickness of the adhesive 40.

Further, when a large strain is caused in the magnetic flux converging plate 10 by the annealing treatment, there may be added a step of performing polishing after the annealing treatment to planarize the surface of the magnetic flux converging plate 10. A peripheral edge of the magnetic flux converging plate 10 may be chipped and tapered when the polishing is performed after the resist 20 is removed, but this situation leads to improvement in sensitivity due to concentrated magnetic flux on the tapered portion, and hence there is no particular problem.

In this case, as the plating substrate 30, a silicon wafer that is the same or has the same shape and the same dimension as the silicon wafer used as the semiconductor substrate 1, or an acrylic plate having the same shape or the same dimension as the silicon wafer used as the semiconductor substrate 1 may be used, and an alignment mark may be formed on each of the semiconductor substrate 1 and the plating substrate 30. In this manner, only by aligning the semiconductor substrate 1 and the plating substrate 30, positional fluctuations between the Hall elements 2 and the magnetic flux converging plate 10 may be reduced, and thus a magnetic sensor having small fluctuations in characteristics may be manufactured.

After the adhesive 40 is cured, as illustrated in FIG. 4B, the plating substrate 30 is peeled off from the base conductive layer 11. In this manner, the magnetic flux converging plate 10 is formed in a desired region as illustrated in FIG. 1. At this time, as described above, the adhesiveness between the plating substrate 30 and the base conductive layer 11 is weak, and hence the plating substrate 30 may be easily peeled off from the base conductive layer 11.

As described above, with this embodiment, the magnetic sensor having small fluctuations or shift in magnetic characteristics due to stress, and the method of manufacturing the magnetic sensor may be provided. Further, the magnetic flux converging plate may be formed by photolithography and electroplating, and hence the manufacturing cost may also be reduced.

The embodiment of the present invention has been described above, but the present invention is not limited to the above-mentioned embodiment, and various modifications can be made thereto without departing from the gist of the present invention.

For example, in the above-mentioned embodiment, the protective film 3 is formed, but the protective film 3 may be omitted.

Further, in the above-mentioned embodiment, an example in which the P-type semiconductor substrate is used as the semiconductor substrate 1 is described, but an N-type semiconductor substrate may be used.

What is claimed is:

1. A magnetic sensor, comprising:
   a semiconductor substrate having Hall elements on a front surface thereof;
   an adhesive layer directly in contact with a back surface of the semiconductor substrate opposite to the front surface;
   a magnetic flux converging plate having a first surface in contact with the adhesive layer, such that the adhesive layer bonds the first surface of the magnetic flux converging plate to the back surface of the semiconductor substrate; and
   a conductive layer on a second surface of the magnetic flux converging plate opposite to the first surface.

2. A magnetic sensor according to claim 1, wherein the semiconductor substrate has a thickness of from 100 μm to 400 μm.

3. A magnetic sensor according to claim 1, wherein the magnetic flux converging plate has a thickness of from 20 μm to 50 μm.

4. A magnetic sensor, comprising:
   a semiconductor substrate having Hall elements on a front surface thereof;
   an adhesive layer directly in contact with a back surface of the semiconductor substrate opposite to the front surface;
   a magnetic flux converging plate having a first surface in contact with the adhesive layer, such that the adhesive layer bonds the first surface of the magnetic flux converging plate to the back surface of the semiconductor substrate, wherein the magnetic sensor further comprising a conductive layer comprising copper on a second surface of the magnetic flux converging plate opposite to the first surface.

5. A magnetic sensor according to claim 4, wherein the semiconductor substrate has a thickness of from 100 μm to 400 μm.

6. A magnetic sensor according to claim 4, wherein the magnetic flux converging plate has a thickness of from 20 μm to 50 μm.

* * * * *